United States Patent
Kim

(10) Patent No.: US 6,753,599 B2
(45) Date of Patent: Jun. 22, 2004

(54) SEMICONDUCTOR PACKAGE AND MOUNTING STRUCTURE ON SUBSTRATE THEREOF AND STACK STRUCTURE THEREOF

(75) Inventor: Byung-Man Kim, Chungcheongnam-do (KR)

(73) Assignee: Samsung Electronics Co., Ltd., Suwon (KR)

(*) Notice: Subject to any disclaimer, the term of this patent is extended or adjusted under 35 U.S.C. 154(b) by 65 days.

(21) Appl. No.: 10/066,195

(22) Filed: Jan. 31, 2002

(65) Prior Publication Data

US 2002/0113325 A1 Aug. 22, 2002

(30) Foreign Application Priority Data

Feb. 12, 2001 (KR) .......................................... 2001-6690

(51) Int. Cl.⁷ ...................... H01L 23/02; H01L 23/48; H01L 23/04
(52) U.S. Cl. ...................... 257/686; 257/646; 257/730
(58) Field of Search ................................ 257/666–677, 257/685–686, 700, 787–795, 696, 730, 692; 438/123–127, 112, 118–119

(56) References Cited

U.S. PATENT DOCUMENTS

| | | | | | |
|---|---|---|---|---|---|
| 4,996,587 | A | * | 2/1991 | Hinrichsmeyer et al. | ... 257/676 |
| 5,394,010 | A | * | 2/1995 | Tazawa et al. | ............... 257/686 |
| 5,475,259 | A | * | 12/1995 | Kasai et al. | ................. 257/692 |
| 6,021,563 | A | * | 2/2000 | Heo et al. | ...................... 29/846 |
| 6,146,919 | A | * | 11/2000 | Tandy | ......................... 438/106 |
| 6,320,251 | B1 | * | 11/2001 | Glenn | .......................... 257/678 |
| 6,424,031 | B1 | * | 7/2002 | Glenn | .......................... 257/686 |

FOREIGN PATENT DOCUMENTS

| | | |
|---|---|---|
| JP | 06-053399 | 2/1994 |
| JP | 06-097349 | 8/1994 |
| JP | 10-084069 | 3/1998 |
| JP | 11-067978 | 9/1999 |
| KR | 20-1998-0018057 | 9/1998 |

OTHER PUBLICATIONS

English language abstract for Korea Patent Application No. 20–1998–0018057.
English language abstract for Japanese Patent Publication No. 11–067978.
English language abstract for Japanese Patent Publication No. 10–084069.
English language abstract for Japanese Patent Publication No. 06–53399.
English language abstract for Japanese Patent Publication No. 06–097349.

* cited by examiner

*Primary Examiner*—Shouxiang Hu
(74) *Attorney, Agent, or Firm*—Marger Johnson & McCollom, P.C.

(57) ABSTRACT

A semiconductor package is provided. In one embodiment, the semiconductor package includes a lead frame having a die pad and a plurality of leads disposed around the die pad. One or more semiconductor integrated circuit chips are mounted on the die pad and electrically connected to the plurality of leads. The semiconductor further includes a molding part for encapsulating the lead frame and the one or more chips. The molding part includes an upper molding portion having a first width, and a lower molding portion having a second width smaller than the first width to expose a portion of said leads from the lower molding portion. With the semiconductor package of the present invention, the mounting area and the mounting height on a substrate can be reduced. Also, the mounting reliability of a package on a substrate and electrical characteristics of the package can be improved.

3 Claims, 3 Drawing Sheets

SEMICONDUCTOR PACKAGE AND MOUNTING STRUCTURE ON SUBSTRATE THEREOF AND STACK STRUCTURE THEREOF

BACKGROUND OF THE INVENTION

1. Field of the Invention

The present invention relates to semiconductor packaging technology and, more particularly, to a semiconductor package having leads and a stack structure of this package.

2. Description of the Related Art

As is well known in the art, semiconductor integrated circuit chips such as memory chips are assembled in packages. The package is mounted on substrates of various electronic components. In order to electrically connect and mechanically attach the packages to a substrate, a lead frame is generally used. FIG. 1 shows a conventional semiconductor package using the lead frame.

As shown in FIG. 1, a semiconductor package 1 comprises two semiconductor integrated circuit chips 2 attached to upper and lower surfaces of a die pad 3 to increase memory capacity. A lead frame comprises the die pad 3 on the center and a plurality of leads 4 disposed around the die pad 3. The die pad 3 mechanically supports the chips 2. The leads 4 electrically connect the semiconductor chips 2 to the substrate 10. The semiconductor chips 2 are electrically connected to the leads 4 by bonding wires 5. The semiconductor chips 2 and the bonding wires 5 are encapsulated with a molding resin such as epoxy molding compound, thereby forming a molding part 6. Outer portions of the leads 4, i.e., outer leads, which are exposed and extend from the molding part 6, are bent in predetermined shapes to be suitably mounted on the substrate 10, and the package 1 is mounted on the substrate 10.

In order to operate the chips 2 on the substrate 10, the conventional package 1 requires a large mounting area and mounting height. As shown in FIG. 1, compared to the dimension and the thickness of the chip 2 itself, the mounting area "a" and the mounting height "h" of the package 1 are excessive. Thus, with this conventional package, it has been difficult to satisfy the pressing demand for smaller and thinner packages. Further, the length of the leads 4 of the package 1 causes signal delay during the chip operation and reduces mounting reliability.

SUMMARY OF THE INVENTION

In accordance with one embodiment of the present invention, a semiconductor package, in which the lower surfaces of leads are partially exposed from a molding part, is provided. The semiconductor package may include a lead frame having a die pad in the center and a plurality of leads disposed around the die pad. The package comprises at least one semiconductor integrated circuit chip attached to the die pad. The lead frame and the chip are encapsulated within the molding part. The molding part includes an upper molding portion having a first width and a lower molding portion having a width smaller than the first width, thereby partially exposing the lower surfaces of the leads from the molding part.

In another embodiment, a mounting structure for the above-described package on a substrate is provided. In this mounting structure, the substrate has a cavity for receiving the lower molding portion of the package. The exposed lower surfaces of the leads may be attached to the substrate with a conductive adhesive.

In an alternative embodiment, the present invention provides a stack structure for stacking at least two of the above-described packages. In each package, projections are formed on the upper molding portion and recesses are formed on the lower molding portion. Each of the projections corresponds to one of the recesses in position and shape. The leads extend from a side surface of the upper molding portion and bent toward the upper molding portion of the package. The packages are stacked by engaging the projections of a lower package with the recesses of an upper package stacks the packages, and the bent parts of the package leads are connected with a conductive adhesive.

With the present invention, the mounting area and the mounting height of a package on a substrate can be reduce. Also, the mounting reliability of a package on a substrate and electrical characteristics of the package can be improved.

BRIEF DESCRIPTION OF THE DRAWINGS

These and other objects, features and advantages of the present invention will be readily understood with reference to the following detailed description provided in conjunction with the accompanying drawings, wherein like reference numerals designate like structural elements, and, in which.

DETAILED DESCRIPTION OF THE PREFERRED EMBODIMENTS

Preferred embodiments of the present invention will be described below with reference to the accompanying drawings.

Figure 2:
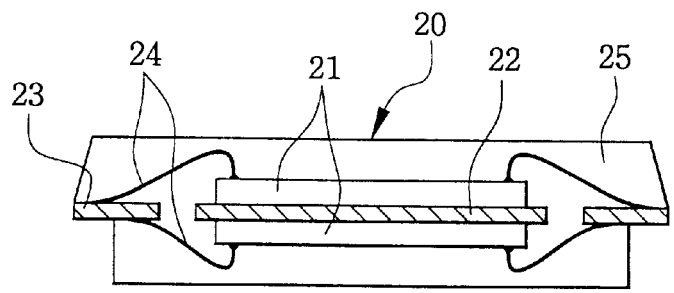
FIG. 2 is a cross-sectional view of a semiconductor package in accordance with an embodiment of the present invention.

FIG. 2 is a cross-sectional view of a semiconductor package in accordance with an embodiment of the present invention.

As shown in FIG. 2, in a semiconductor package 20, lower surfaces of leads 23 are partially exposed and extend horizontally from the molding part 25 and serve as external connection terminals. Lead frames comprise a die pad 22 in the center and a plurality of the leads 23 disposed around the die pad 22. The die pad 22 is substantially coplanar with the leads 23 as illustrated. Semiconductor integrated circuit chips 21 are attached to the upper and the lower surface of the die pad 22. The chips 21 are electrically connected to the leads 23 by conventional electrical connection means such as bonding wires 24. The chips 21, the die pad 22, the leads 23, and the bonding wires 24 are encapsulated by the molding part 25.

The lead frames 22, 23 are preferably made of Cu-alloy or Fe-alloy by a stamping or etching method. A person skilled in the art will appreciate that other suitable metals can be used for the lead frames 22, 23. Portions of the leads 23, which are connected with the bonding wires 24, are plated with a metal such as Ag or Ni. The chips 21 are attached to the die pad 22 by an adhesive such as Ag-epoxy or an adhesive tape such as polyimide.

Herein, memory chips such as DRAM chips or flash memory chips are used as the chips 21. However, non-memory chips may also be used. Although this embodiment of the present invention employs two semiconductor integrated circuit chips 21, each attached to a surface of the die pad 22, there may also be a single chip 21 attached to one surface of the die pad 22 only. Further, in case of using two chips 21, the chips may be the same kind or different kinds of chips. For example, in order to increase memory capacity, the package comprises the same kind of chips.

Electrode pads are formed on the upper active surface of the semiconductor chip 21 and connected to the bonding wires 24. The bonding wires 24 are preferably Au wires, but may be made of various other metals. The molding part 25 is made of a thermosetting resin such as epoxy compound. The molding part 25 is generally formed by a molding method. That is, after providing an unfinished package within a mold, an epoxy molding compound (EMC) is injected into the mold under high temperature and high pressure, thereby forming the molding part 25 after the epoxy compound hardens.

The molding part 25 of this embodiment of the present invention is characterized in that the lower molding part has a width smaller than the upper molding part. As a result, the lower surfaces of the leads 23 are partially exposed from the lower molding part. The different widths are easily achieved by modifying the shape of the mold itself.

Figure 3:
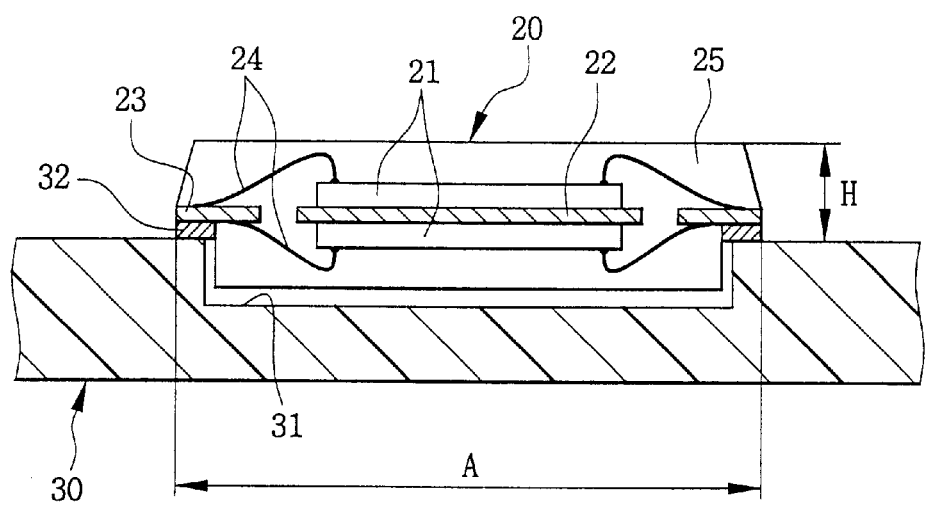
FIG. 3 is a cross-sectional view of a mounting structure of the semiconductor package in FIG. 2 on a substrate.

Since the exposed parts of the leads 23 serve as the external connection terminals, the package 20 does not require conventional outer leads. Therefore, the width of package 20 is reduced, effectively decreasing the mounting area required on a substrate. FIG. 3 shows a mounting structure of the semiconductor package 20 on a substrate 30.

As shown in FIG. 3, the substrate 30 comprises a cavity 31 in the upper surface thereof. The cavity 31 has a predetermined width and height so as to receive the lower portion of the molding part 25 on package 20. The exposed lower surfaces of the leads 23 are attached to the substrate 30 with a conductive adhesive 32. Predetermined circuit patterns (not shown) are formed on the substrate 30. Connection parts such as land pads can be formed on the upper surface of the substrate 30. Preferably, the conductive adhesive 32 is made of a melting alloy such as solder, but is not limited to this material only.

Figure 1:
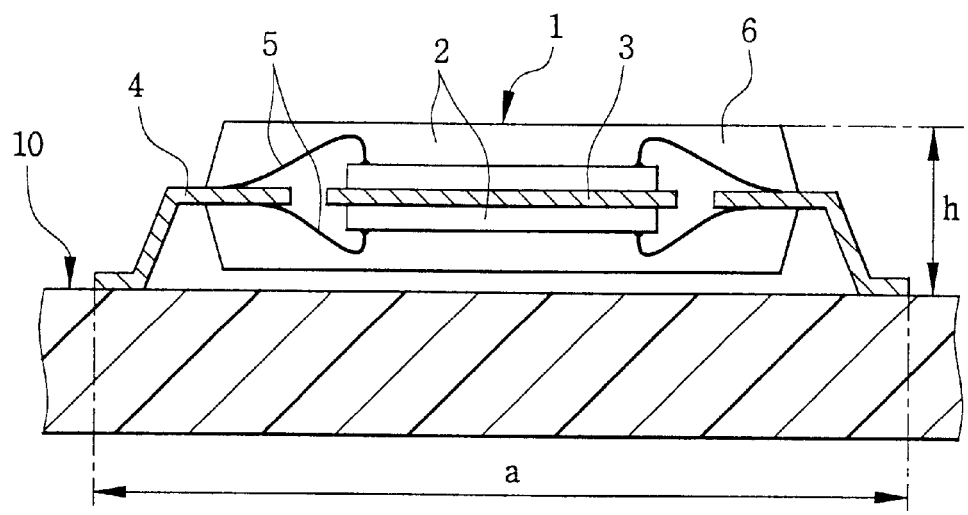
FIG. 1 is a cross-sectional view of a conventional semiconductor package mounted on a substrate.

Compared to the conventional mounting area a and mounting height h of FIG. 1, the mounting area A and mounting height H of the package 20 of the present invention on the substrate 30 are drastically reduced. Therefore, the mounting density of the package 20 on the substrate 30 increases, facilitating smaller and thinner electronics. Further, the short signal transmission path between the chips 21 and the substrate 30 improves electrical characteristics, and the insertion mounting structure of the package 20 on the substrate 30 increases the mounting reliability of the package 20.

Figure 4:
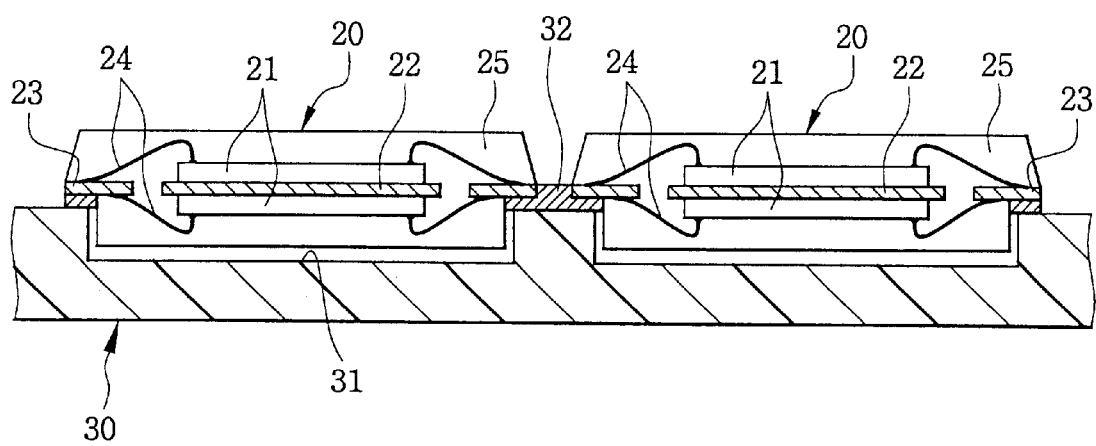
FIG. 4 is a cross-sectional view of a mounting structure of the semiconductor package in FIG. 2 on a substrate in accordance with another embodiment of the present invention.

FIG. 4 shows another mounting structure of the package 20 on the substrate 30. As shown in FIG. 4, the substrate 30 comprises a plurality of parallel-formed cavities 31, preferably, each cavity 31 for receiving one package 20. If the packages 20 have the same type of chips 21, the packages 20 are parallel mounted on each cavity 31. Opposite leads 23 between the neighboring packages 20 are interconnected with the same conductive adhesive 32.

Figure 5:
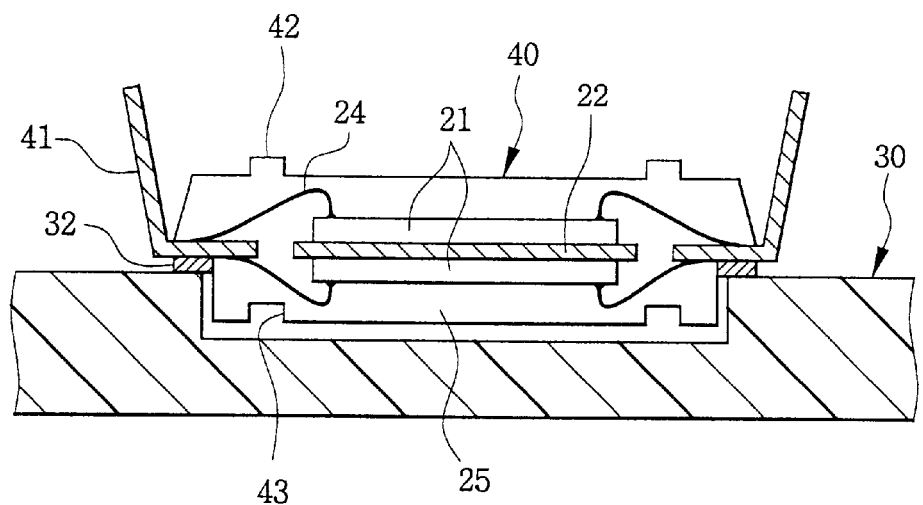
FIG. 5 is a cross-sectional view of a semiconductor package and its mounting structure on a substrate in accordance with still another embodiment of the present invention.
Figure 6:
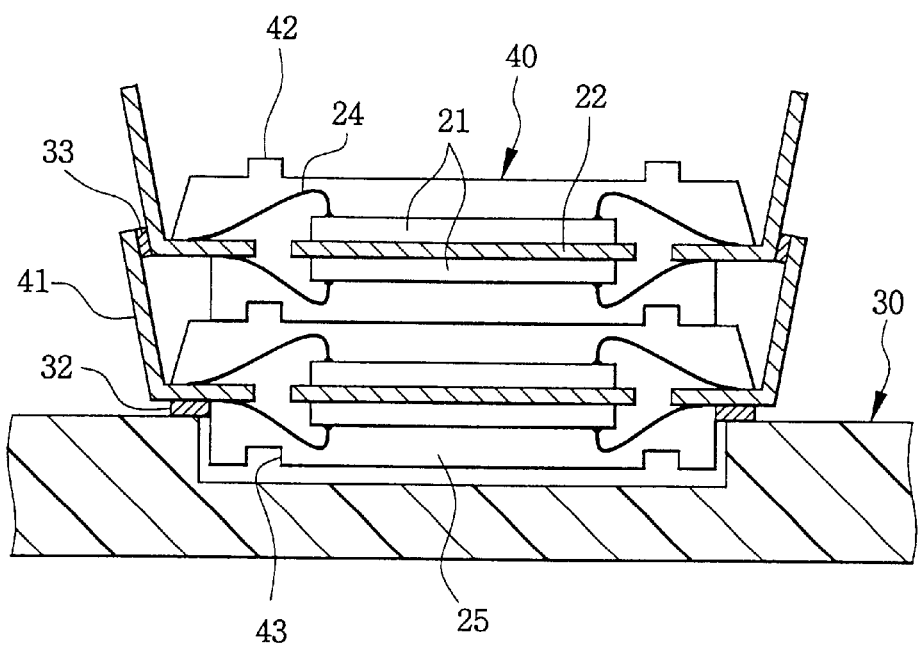
FIG. 6 is a cross-sectional view of a stack structure of a semiconductor package in accordance with yet another embodiment of the present invention.

FIGS. 5 and 6 show a semiconductor package, its mounting structure, and a stack structure in accordance with still another embodiment of the present invention. As shown in FIGS. 5 and 6, a package 40 comprises a molding part 25 having an upper portion with a predetermined width and a lower portion with a width smaller than the upper portion, and a plurality of leads 41 whose lower surfaces are partially exposed from the lower portion of molding part 25. The package 40 comprises projections 42 formed on the upper portion of the molding part 25 and grooves or recesses 43 formed on the lower portion of the molding part 25. The leads 41 extend upwardly and/or outwardly from side surfaces of molding part 25.

The projections 42 on the upper portion of the molding part 25 correspond to the recesses 43 on the lower portion of the molding part 25. The projections 42 and the recesses 43 have complementary shapes, so that they are interlocked. More particularly, as shown in FIG. 6, a lower package 50 and an upper package 55 are vertically stacked by engaging the projection 42 of the lower package 50 with the recesses 43 of the upper package 55. Thus, a stack module 60 can be achieved. The packages 50, 55 are electrically interconnected to each other by attachments between the extending portions of leads 41. The extending portions of the leads 41 of the lower package 50 are attached to the extending portions of the leads 41 of an upper package by interposing a conductive adhesive 33 between them. The lower surfaces of the extending portions of the leads 41 of the lower package 50 are attached to the substrate 40 with the conductive adhesive 32.

Accordingly, since the semiconductor package of the present invention reduces the mounting area and the mounting height on a substrate, this package is applicable to smaller and thinner electronics. Moreover, the short signal transmission path between the chip and the substrate improves electrical characteristics, and the insertion mounting structure of the package on the substrate increases the mounting reliability of the package. Also, the present invention improves solder bonding reliability between the package and the substrate, and prevents chips from being damaged by external impacts.

Although the preferred embodiments of the present invention have been described in detail hereinabove, it should be understood that many variations and/or modifications of the basic inventive concepts herein taught which may appear to those skilled in the art will still fall within the spirit and scope of the present invention as defined in the appended claims.

What is claimed is:

1. A stack structure comprising a lower package and an upper package, the upper package stacked above the lower package, each package respectively comprising:
    a lead frame having a die pad and a plurality of leads disposed around the die pad;
    at least one semiconductor integrated circuit chip attached to the die pad; and
    a molding part for encapsulating the lead frame and the chip,
    wherein the molding part includes an upper molding portion having a first width; a lower molding portion having a second width smaller than the first width such that the lower surfaces of a portion of the leads are exposed while the upper surfaces of the portion of the leads are covered by the upper molding portion, the upper molding portion disposed above the lead frame and the lower molding portion disposed below the lead frame, the exposed portion of the leads located outside the lower molding portion; projections formed on the upper molding portion; and recesses formed in the lower molding portion, each of the projections corresponding to a respective one of the recesses in position and shape, and the leads extend from a side surface of the upper molding portion and bend upward and away from the upper molding portion, wherein the packages are stacked by engaging the projections of the lower package with the recesses of the upper package, and the bending parts of the leads of the semiconductor packages are interconnected with a conductive adhesives, wherein the plurality of leads each comprise an inner lead and an outer lead, the outer lead extending from the side surface of the upper molding portion, the outer lead having an upper end and a lower end, and wherein the upper end of the outer lead of the lower package is connected to the lower end of the outer lead of the upper package.

2. The stack structure of claim 1, further comprising a substrate having a cavity configured to receive the lower molding portion of the lower package, wherein the exposed lower surfaces of the leads of the lower package are attached to the substrate.

3. The stack structure of claim 1, wherein the chip is electrically connected to the leads in each of said packages through wire bonding.

* * * * *

UNITED STATES PATENT AND TRADEMARK OFFICE
CERTIFICATE OF CORRECTION

PATENT NO.   : 6,753,599 B2
DATED         : June 22, 2004
INVENTOR(S)  : Kim

It is certified that error appears in the above-identified patent and that said Letters Patent is hereby corrected as shown below:

Column 5,
Line 16, "conductive adhesives, wherein" should read -- conductive adhesive, wherein --.

Signed and Sealed this

Second Day of November, 2004

JON W. DUDAS
*Director of the United States Patent and Trademark Office*